US012558748B2

(12) United States Patent
Chen et al.

(10) Patent No.: US 12,558,748 B2
(45) Date of Patent: Feb. 24, 2026

(54) METHOD AND VARIABLE SYSTEM FOR ADJUSTING WORKPIECE-SUPPORTING MODULE

(71) Applicant: Industrial Technology Research Institute, Hsinchu (TW)

(72) Inventors: Chun-Ting Chen, Taichung City (TW);
Chien-Chih Liao, Taichung City (TW);
Pei-Yin Chen, Taichung City (TW);
Jen-Ji Wang, Taichung City (TW);
Yu-Sheng Lai, Taichung City (TW)

(73) Assignee: Industrial Technology Research Institute, Hsinchu (TW)

( * ) Notice: Subject to any disclaimer, the term of this patent is extended or adjusted under 35 U.S.C. 154(b) by 1089 days.

(21) Appl. No.: 17/225,633

(22) Filed: Apr. 8, 2021

(65) Prior Publication Data

US 2022/0176504 A1     Jun. 9, 2022

(30) Foreign Application Priority Data

Dec. 3, 2020    (TW) ................................. 109142581

(51) Int. Cl.
*G06F 30/12*        (2020.01)
*B23Q 1/03*        (2006.01)
(Continued)

(52) U.S. Cl.
CPC ............. *B23Q 1/035* (2013.01); *B23Q 3/103* (2013.01); *G06F 30/12* (2020.01); *G06F 30/13* (2020.01); *G06F 30/17* (2020.01); *G06F 30/23* (2020.01)

(58) Field of Classification Search
CPC ........ B23Q 1/035; B23Q 3/103; B23Q 1/037; G06F 30/12; G06F 30/13; G06F 30/17;
(Continued)

(56) References Cited

U.S. PATENT DOCUMENTS 5,364,083 A    11/1994  Ross et al.
6,353,768 B1 *   3/2002  Karafillis ................ G06F 30/23
                                              700/145
(Continued)

FOREIGN PATENT DOCUMENTS

CN        103100889 B    5/2015
CN        105373653 A    3/2016
(Continued)

OTHER PUBLICATIONS

TW OA issued on Feb. 9, 2022.
(Continued)

*Primary Examiner* — Nithya J. Moll
(74) *Attorney, Agent, or Firm* — WPAT, PC

(57)                    ABSTRACT

A method for adjusting a workpiece-supporting module includes: setting initial support position information of a workpiece, the initial support position information including positions of support devices and a spacing value for separating the support devices; according to the initial support position information, applying a finite element method to analyze a CAD file of the workpiece to obtain workpiece deformation information; according to the workpiece deformation information and target workpiece deformation information, realizing support position information corresponding to each support device, the support position information including X-axis coordinates and Y-axis coordinates; according to the support position information and a conversion program, obtaining a Z-axis coordinate and a normal vector of each support devices; and, according to the support position information, the Z-axis coordinate and the normal vector, adjusting the position and the angle of each support device. In addition, a variable system for adjusting the same workpiece-supporting module is also proposed.

5 Claims, 10 Drawing Sheets

(51) Int. Cl.

| | | |
|---|---|---|
| *B23Q 3/10* | (2006.01) |
| *G06F 30/13* | (2020.01) |
| *G06F 30/17* | (2020.01) |
| *G06F 30/23* | (2020.01) |

(58) Field of Classification Search

CPC ...... G06F 30/23; G06F 2119/18; G06F 30/15; G06F 2113/26

See application file for complete search history.

(56) References Cited

U.S. PATENT DOCUMENTS

| | | | |
|---|---|---|---|
| 7,584,947 B2 | 9/2009 | Freeland | |
| 8,495,811 B2 | 7/2013 | Zoppi et al. | |
| 9,776,329 B2 | 10/2017 | Kai et al. | |
| 2007/0020065 A1 | 1/2007 | Kirby | |
| 2007/0069436 A1 | 3/2007 | Zarske | |
| 2009/0126187 A1 | 5/2009 | Kajiyama et al. | |
| 2011/0190941 A1 | 8/2011 | Marsh et al. | |
| 2017/0100839 A1* | 4/2017 | Kai | F16M 11/2014 |
| 2018/0333865 A1* | 11/2018 | Bacci | B25J 15/0683 |
| 2019/0243343 A1 | 8/2019 | Kiefer et al. | |
| 2020/0391333 A1* | 12/2020 | Murai | B25J 9/1669 |
| 2021/0154781 A1 | 5/2021 | Chen et al. | |

FOREIGN PATENT DOCUMENTS

| | | |
|---|---|---|
| CN | 106202754 A | 12/2016 |
| CN | 107138974 A | 9/2017 |
| CN | 108890225 A | 11/2018 |
| CN | 1107274245 A | 1/2020 |
| CN | 111002064 A | 4/2020 |
| TW | I505902 B | 11/2015 |

OTHER PUBLICATIONS

Bakker et al. "Recent Research on Flexible Fixtures for Manufacturing Processes", 2013, EurekaSelect.

Xu "New Flexible Tooling For Carbon Fiber Components", 2013, Chalmers University of Technology Gothenburg, Sweden.

Kostyrka "Kostyrka Flexible Tooling. Universal Holding Fixture (UHF)", GmbHJournal name: KostyrkaPublication year: 2015.

Li "Parameters Identification of Flexibly Supported Composite Plate Structures", Mar. 2006, National Chiao Tung University.

Gameros et al. "State-of-the-art in fixture systems for the manufacture and assembly of rigid components: A review", International Journal of Machine Tools and Manufacture 123, 2017 pp. 1-21.

Li et al. "Design and application of flexible fixture", Procedia CIRP56 (2016) 528-532, ScienceDirect.

CN OA issued on May 16, 2025.

\* cited by examiner

S100

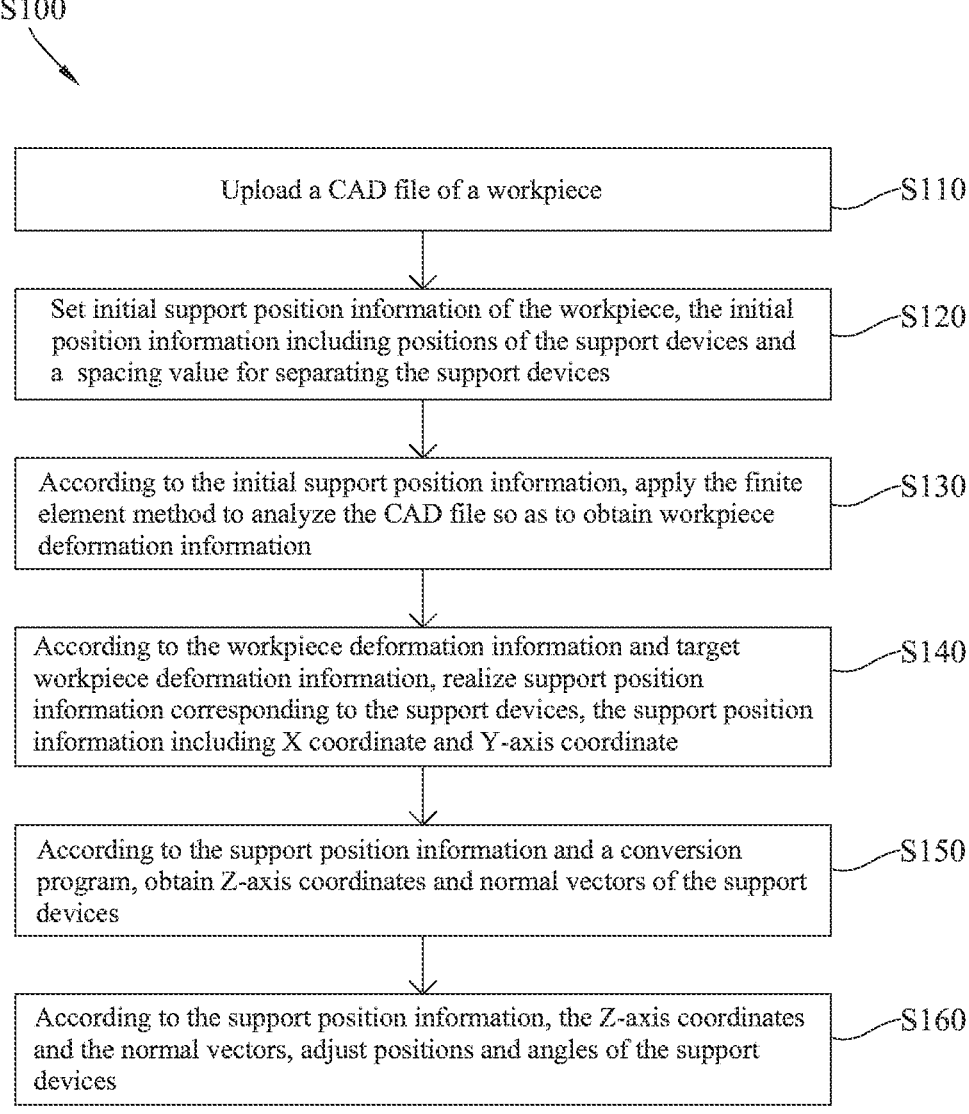

Upload a CAD file of a workpiece ⎯S110

Set initial support position information of the workpiece, the initial position information including positions of the support devices and a spacing value for separating the support devices ⎯S120

According to the initial support position information, apply the finite element method to analyze the CAD file so as to obtain workpiece deformation information ⎯S130

According to the workpiece deformation information and target workpiece deformation information, realize support position information corresponding to the support devices, the support position information including X coordinate and Y-axis coordinate ⎯S140

According to the support position information and a conversion program, obtain Z-axis coordinates and normal vectors of the support devices ⎯S150

According to the support position information, the Z-axis coordinates and the normal vectors, adjust positions and angles of the support devices ⎯S160

FIG. 2

METHOD AND VARIABLE SYSTEM FOR ADJUSTING WORKPIECE-SUPPORTING MODULE

CROSS REFERENCE TO RELATED APPLICATION

This application claims the benefits of Taiwan application Serial No. 109142581, filed Dec. 3, 2020, the disclosures of which are incorporated by references herein in its entirety.

TECHNICAL FIELD

The present disclosure relates in general to a variable system for adjusting a module for supporting a workpiece, and more particularly to a variable system for adjusting a module for supporting a thin workpiece having a curve surface or an irregular shape.

BACKGROUND

Since the composite material has a light weight but higher strength, thus it is widely applied to various industries, such as the automobile, aerospace and vessel industries. In the art, while a composite-material part is machined, a fixed mold is usually applied for auxiliary fixation. To versatile large workpieces that are not mass produced, the molds shall be particularly developed, and generally the corresponding disassembling procedures are usually tedious. In addition, storage of these molds may occupy a huge room. Especially, to machine the larger part for the vessel or aerospace industry, the molds for fixation are usually huge as well. Since sizes of the molds for fixation are hard to be reduced, the associated manufacturing cost would be high, and hardly meet the special production requirements for these versatile large workpiece.

To resolve the aforesaid shortcomings at the fixed molds, flexible fixing molds are gradually introduced into the marketplace. However, in manufacturing those versatile large-scale less-production workpieces, the arrangement of current flexible fixing molds for supporting the workpiece is dense with fixed spacing, and unchangeable. For example, in a design disclosed in an application Ser. No. 16/805,133, the related cost is comparatively high. Also, in order to have suckers of supportive units to adhere a working surface, most of the supportive units are forced to adopt a passive universal joint design. Thus, a plenty of setting time is needed for manually adjusting and calibrating adhering angles of the corresponding supportive units.

In addition, to support workpieces with different materials and outlines, since positions with the weakest strength might vary from one workpiece to another workpiece. Thus, if supporting of the workpieces is kept the same pattern to provide the same support locations to different workpieces, excessive local deformation might be met to some workpieces.

Hence, the issue how to improve the aforesaid shortcomings is definitely urgent to the skill in the art.

SUMMARY

It is an object of this disclosure to provide a method for adjusting a workpiece-supporting module and a variable system for adjusting the same workpiece-supporting module, by which, after a workpiece is supported, by having the least deformation as a target, preferable support points can be searched precisely for fixing the versatile workpieces with the least deformation.

In one embodiment of this disclosure, a method for adjusting a workpiece-supporting module includes the steps of: (a) setting initial support position information of a workpiece, wherein the initial support position information includes positions of a plurality of support devices and a spacing value for separating two said neighboring support devices of the plurality of support devices; (b) according to the initial support position information, applying a finite element method to analyze a CAD file of the workpiece to further obtain workpiece deformation information; (c) according to the workpiece deformation information and target workpiece deformation information, realizing support position information corresponding to each of the plurality of support devices, wherein the support position information includes X-axis coordinates and Y-axis coordinates; (d) according to the support position information and a conversion program, obtaining a Z-axis coordinate and a normal vector of each of the plurality of support devices; and, (e) according to the support position information, the Z-axis coordinate and the normal vector, adjusting the position and the angle of each of the plurality of support devices.

In another embodiment of this disclosure, a variable system for adjusting a workpiece-supporting module, includes an adjustable support module, an analysis module, a coordinate-processing module and a control module. The adjustable support module includes a plurality of support devices, and each of the plurality of support devices has initial support position information. The initial support position information includes positions of a plurality of support devices and a spacing value for separating two said neighboring support devices of the plurality of support devices. The analysis module, used for receiving a CAD file of a workpiece, applies a finite element method to analyze the CAD file so as to obtain workpiece deformation information. The coordinate-processing module is used for evaluating the workpiece deformation information and target workpiece deformation information to realize support position information corresponding to each of the plurality of support devices. The support position information includes X-axis coordinates and Y-axis coordinates. The coordinate-processing module is also used for further evaluating the support position information and a conversion program to obtain a Z-axis coordinate and a normal vector of each of the plurality of support devices vector. The control module is used for evaluating the support position information, the Z-axis coordinate and the normal vector to adjust a position and an angle of each of the plurality of support devices.

As stated, in the method for adjusting a workpiece-supporting module and the variable system for adjusting the same workpiece-supporting module provided b the present disclosure, the finite element method is applied to analyze the CAD file of the workpiece, so that the workpiece deformation information can be obtained. Further, by having the least deformations as the search target for the workpiece, the optimal support points for the workpiece can be realized. In addition, the coordinate-processing module is used to obtain the X-axis coordinates, the Y-axis coordinates, the Z-axis coordinates and the normal vectors of the corresponding support devices, and further the control module is used to adjust the target positions (including the X-axis coordinates, the Y-axis coordinates and the corresponding Z-axis coordinates) and angles of the corresponding support devices and angle for supporting the workpiece.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 2 is a schematic flowchart of an embodiment of the method for adjusting a workpiece-supporting module in accordance with this disclosure;

FIG. 3-1 is a schematic perspective view of mechanisms for the variable system for adjusting a workpiece-supporting module in accordance with this disclosure;

FIG. 3-2 is a schematic view of support points for the variable system for adjusting a workpiece-supporting module in accordance with this disclosure;

DETAILED DESCRIPTION

Figure 1:
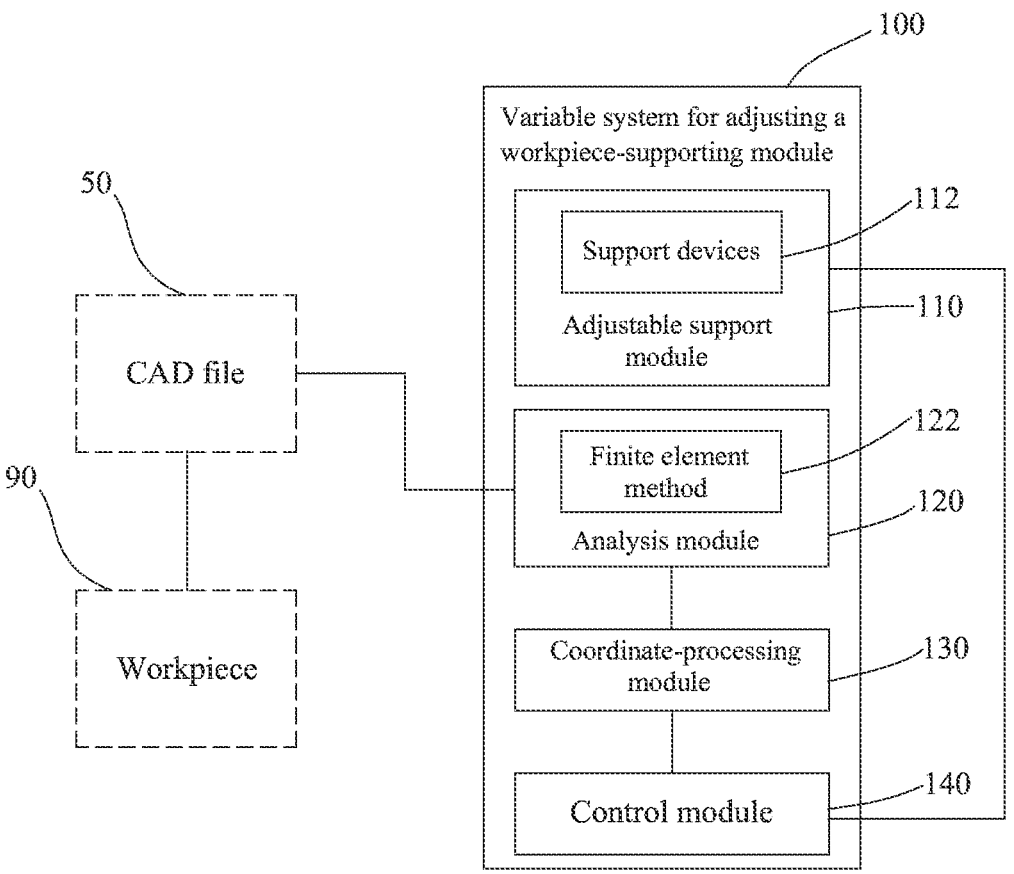
FIG. 1 is a schematic block view of an embodiment of the variable system for adjusting a workpiece-supporting module in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, a schematic block view of an embodiment of the variable system for adjusting a workpiece-supporting module in accordance with this disclosure is shown. In this embodiment, the variable system for adjusting a workpiece-supporting module 100 is applied to support a workpiece 90. The workpiece 90 can be a thin workpiece having a curve surface or an irregular outline. Also, the workpiece 90 can be made of a single material such as a metallic material or a composite material. The variable system for adjusting a workpiece-supporting module 100 includes an adjustable support module 110, an analysis module 120, a coordinate-processing module 130 and a control module 140. The analysis module 120 is to receive a CAD (Computer Aided Design) file 50 of the workpiece 90, and the finite element method 122 is applied to analyze the CAD file 50 for obtaining workpiece deformation information. In this embodiment, the least deformation of the workpiece 90 is the target, from which the most relevant support points at the workpiece 90 can be obtained. The coordinate-processing module 130 is used for obtaining an X coordinate, a Y-axis coordinate, a Z-axis coordinate and a normal vector of each of the support devices 112. The control module 140 evaluates the X coordinate, the Y-axis coordinate, the Z-axis coordinate and the normal vector of each of the support devices 112 obtained by the coordinate-processing module 130 to modulate a position (including a horizontal surface formed by the X and Y-axis coordinates and the vertical Z-axis coordinate) and an angle (formed between an A axis and a C axis) for each of the support devices 112 to reach, such that the workpiece 90 can be loaded by these support devices 112 in a least-deformation manner Thereupon, the most relevant support effect can be obtained.

Figures 1, 3:
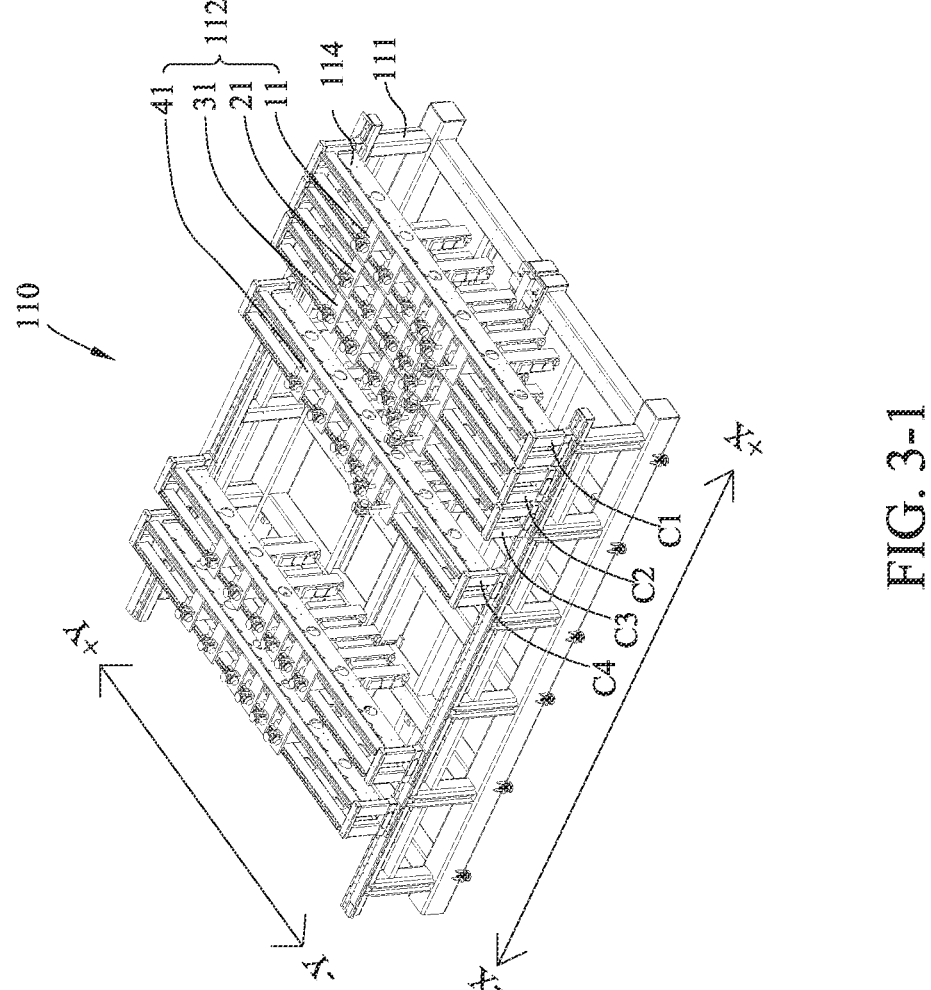
Figures 2, 3:
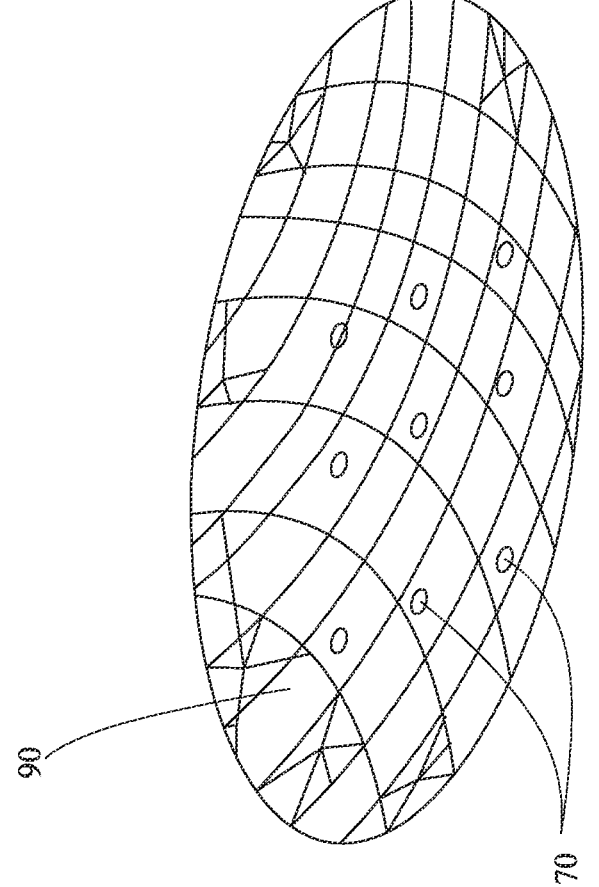

In the following description, a schematic flowchart of an embodiment of the method for adjusting a workpiece-supporting module in accordance with this disclosure shown in FIG. 2 and a schematic perspective view of mechanisms for the variable system for adjusting a workpiece-supporting module in accordance with this disclosure shown in FIG. 3-1 are used to elucidate the method for adjusting a workpiece-supporting module S100 and the variable system for adjusting a workpiece-supporting module 100. As shown, the method for adjusting a workpiece-supporting module S100 includes Step S110 to Step S160. Firstly, in performing Step S110, a CAD file 50 for a workpiece 90 is loaded. In addition, Step S110 further includes a step of providing an adjustable support module 110 as shown in FIG. 3-1, in which the adjustable support module 110 may include a support frame 111, a plurality of support assemblies 114 (six in this embodiment) mounted on the support frame 111 and movable in the X-axis direction, and a plurality of support devices 112 (six in this embodiment) mounted on each of the support assemblies 114 and movable individually in the Y-axis direction on the support frame 111. In this embodiment, the support device 112 can further include A-axis, Z-axis and C-axis motion members (see FIG. 8 and U.S. Pat. No. 9,776,329).

Then, in performing Step S120, initial support position information of the workpiece 90 is defined, in which the initial support position information includes a plurality of positions of the support devices 112 and spacing values between the support devices 112 for ensuring each of the support devices 112 not to move across the other support device 112. In addition, according to practical situations, the initial support position information further includes a plurality of positions of the support assemblies 114 and spacing values between the support assemblies 114 for ensuring each of the support assemblies 114 not to move across the other support assembly 114. Then, the support assemblies 114 and the support devices 112 are further limited to move within an occupation region of the workpiece 90.

Figure 4:
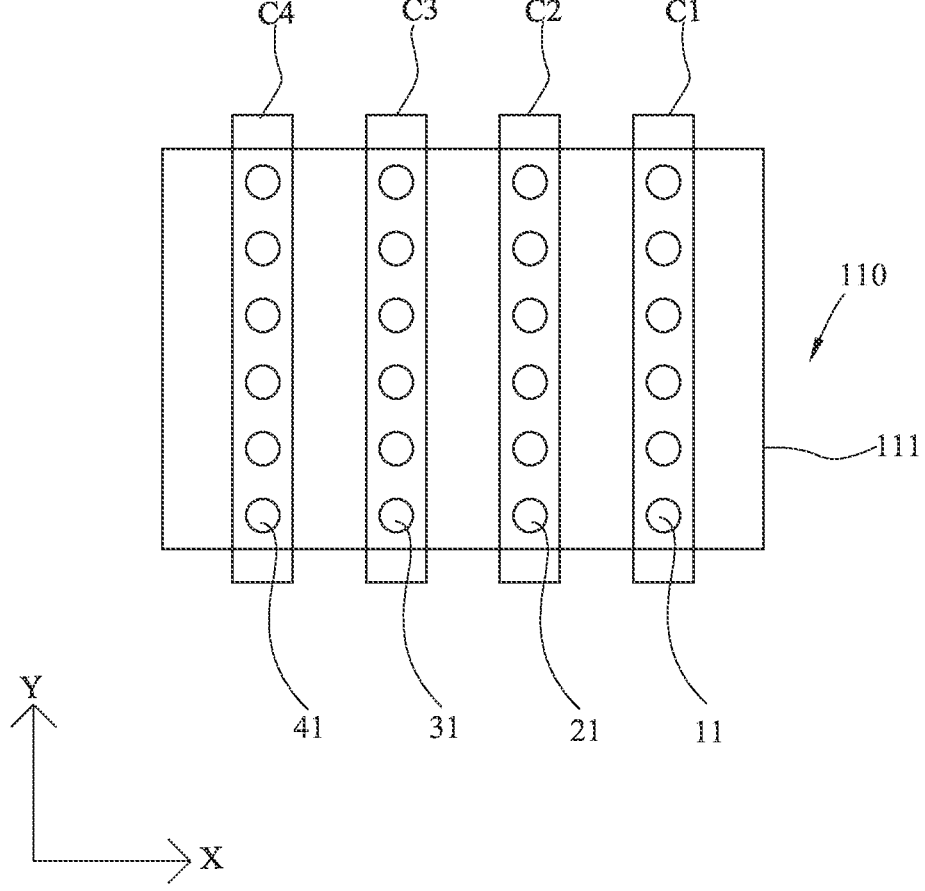
FIG. 4 is a schematic view of an embodiment of the arrangement of the support devices in accordance with this disclosure.

Then, in performing Step S130, the analysis module 120 evaluates the initial support position information to obtain workpiece deformation information by utilizing a relevant analysis method such as a finite element method 122 to analyze the CAD file 50 of the workpiece 90. In this embodiment, the analysis method used by the analysis module 120 is the finite element method 122 (through the ANSYS commercial software for example). The optimization target for the analysis module 120 to achieve by applying the finite element method 122 is a situation that the workpiece 90 can have a least deformation after being supported by the variable system of this disclosure. After being analyzed through the finite element method 122, the final set of the support points 70 would be said to be the optimal support points, as shown in FIG. 3-2. Practically, Step S130 includes a step of defining an initial position as the corresponding fixed spacing for each of the support assemblies 114 and the support devices 112, and as the initial support position information as well. In FIG. 3-1 or FIG. 4, four support assemblies 114 including a first-row support assembly C1, a second-row support assembly C2, a third-row support assembly C3 and a fourth-row support assembly C4 can be orderly and parallel arranged in the X-axis direction. In particular, the first-row support assembly C1, the second-row support assembly C2, the third-row support assembly C3 and the fourth-row support assembly C4 are equally spaced. Each row of the support assemblies 114 includes a plurality of the first support devices 11, a plurality of the second support devices 21, a plurality of the third support devices 31 and a plurality of the fourth support devices 41, respectively. As shown, six said first support devices 11 are arranged along the first-row support assembly C1 in the Y-axis direction, and these six first support devices 11 are equally spaced by fixed spacing. Also, six said second support devices 21 are arranged along the second-row support assembly C2 in the Y-axis direction, and these six second support devices 21 are equally spaced by fixed spacing. Similarly, six said third support devices 31 are arranged along the third-row support assembly C3 in the Y-axis direction, and these six third support devices 31 are equally spaced by fixed spacing. In addition, six said fourth support devices 41 are arranged along the fourth-row support assembly C4 in the Y-axis direction, and these six fourth support devices 41 are equally spaced by fixed spacing.

Then, the analysis module 120 evaluates the initial support position information to perform initial-point setting for the distributed supportive points at the workpiece 90, so as to obtain a set of support points 70 at the workpiece 90. Then, based on the support points 70, the finite element method 122 can be introduced to analyze deformations at the workpiece 90.

Then, in performing Step S140, according to the workpiece deformation information and target workpiece deformation information, support position information corresponding to the support devices 112 can be realized, in which the support position information includes X coordinates and Y-axis coordinates. In one embodiment, according to the workpiece deformation information and the target workpiece deformation information, another support position information corresponding to each of the support assemblies 114 can be also realized, in which this support position information includes X coordinates and Y-axis coordinates. Accordingly, in Step S140, the finite element method 122 is used to analyze the deformations of the workpiece, and an algorithm of this disclosure would be applied to determine whether or nor the workpiece deformations have achieved the corresponding maximums. Practically, Step S140 includes a step of defining a search variable as a position $x_i$ of each of the support assemblies 114 and the support devices 112, in which the position $x_i$ is the position of the support device for the i-th iteration. Then, according to a target function, it is determined whether or not the workpiece deformation information at the i-th iteration is smaller than a convergent percentage. The target workpiece deformation information $Mean_N$ can be expressed by an equation (1) as follows, and another equation (2) is applied to determine whether or not the instant deformations of the workpiece 90 meet the least deformations defined by the target function:

$$Mean_N = \frac{\sum_1^N FEM(xi)}{N}; \tag{1}$$

$$\frac{|Mean_N - Mean_{N-1}|}{Max(FEM(x_i)|_{i=1\sim N}) - Max(FEM(x_i)|_{i=1\sim N})} < \frac{S}{100}. \tag{2}$$

In equation (1), FEM (xi) stands for the derived workpiece deformations at the support points 70 from the i-th finite element calculation, N stands for the N-th iterations, and S stands for the convergent percentage. The convergent percentage S can be defined according to practical properties of the workpiece 90. In equation (2), the derived deformation of the workpiece 90 calculated through the finite element method 122 is judged to determine if the optimization calculation is convergent or not; i.e., to determine if or not a computation value at the left hand side of equation (2) is less than S/100. If a convergence is yet to reach, then, after the search variable is iterative updated, go back to equation (2) to keep determining whether or not the workpiece deformation information is less than a convergent percentage. On the other hand, if the convergence is reached, then it is determined that this optimal variable is the optimal value for the corresponding support point.

Figure 5:
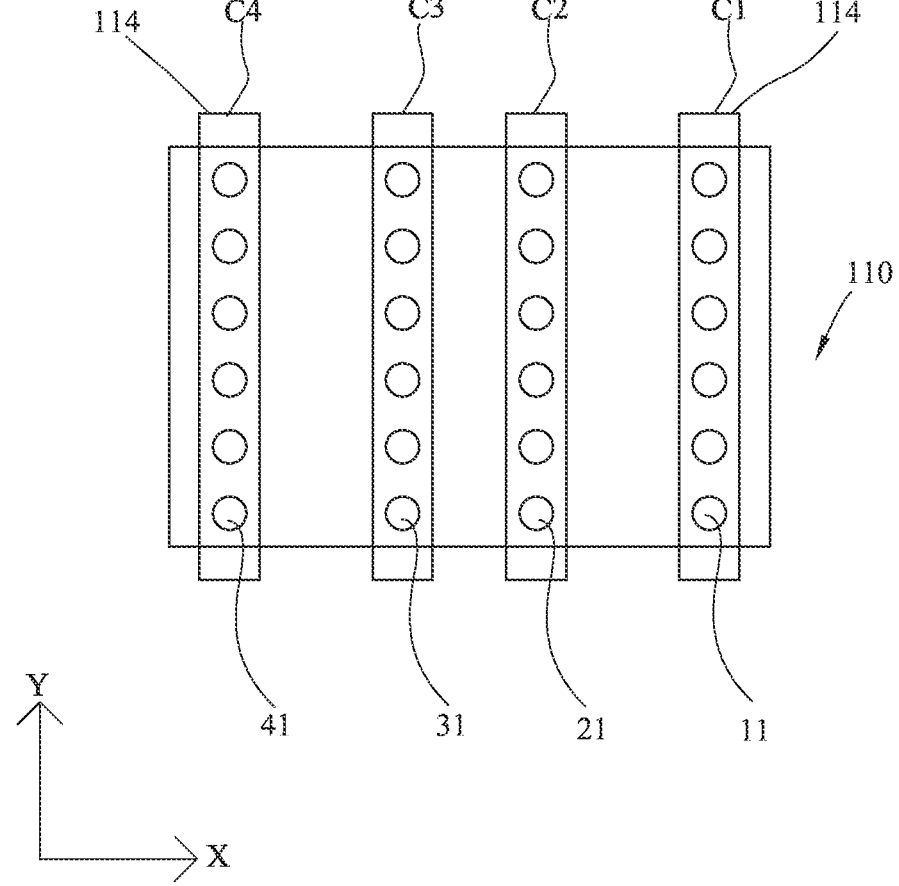
FIG. 5 is a schematic view of another embodiment of the arrangement of the support devices in accordance with this disclosure.

For example, refer to FIG. 4 and FIG. 5. In FIG. 4, the first-row support assembly C1, the second-row support assembly C2, the third-row support assembly C3 and the fourth-row support assembly C4 are separated by a fixed interval. In addition, any of the first support devices 11 is separated from the neighboring first support device 11 by a first constant distance, any of the second support devices 21 is separated from the neighboring second support device 21 by a second constant distance, any of the third support devices 31 is separated from the neighboring third support device 31 by a third distance, and any of the fourth support devices 41 is separated from the neighboring fourth support device 41 by a fourth distance. By comparing FIG. 5 to FIG. 4, a major difference is that, in FIG. 5, the first-row support assembly C1, the second-row support assembly C2, the third-row support assembly C3 and the fourth-row support assembly C4 are not equally spaced. After the calculations in Step S140, the maximum deformation of the workpiece 90 obtained from the arrangement of FIG. 4 is 0.24 mm, while that from the arrangement of FIG. 5 is 0.14 mm Obviously, it implies that, by shifting two of the four support assemblies 114 as shown in FIG. 5, the maximum deformation of the workpiece 90 can be reduced by 40%. In other word, the arrangement of FIG. 5 is superior to that of FIG. 4 in providing support points 70 to support the workpiece 90.

Figure 6:
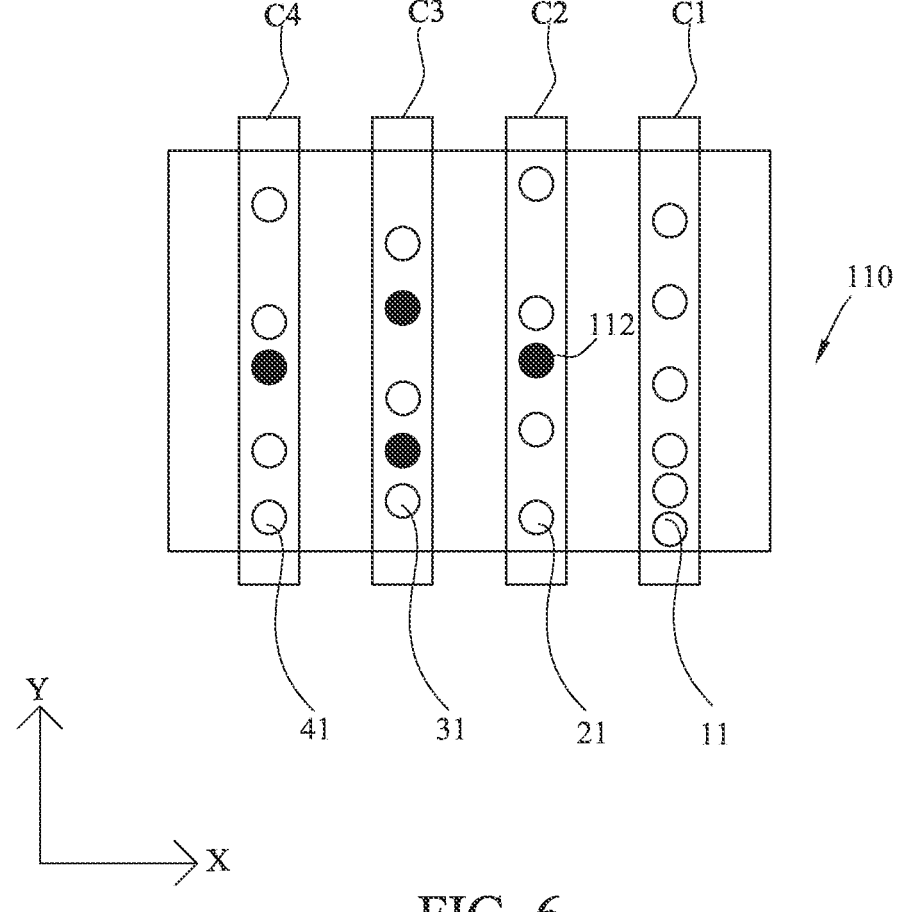
FIG. 6 is a schematic view of a further embodiment of the arrangement of the support devices in accordance with this disclosure.

It is noted that the same quantity of the support devices 112 is used in both arrangements in FIG. 4 and FIG. 5. However, this disclosure is not limited to apply only the same quantity of the support devices 117. The Step S140 can further include a step of determining whether or not the workpiece deformation information is within a demanding range. If positive, part of the support devices 112 can be moved into the occupation region of the workpiece 90. If negative, it is further determined whether or not the workpiece deformation information is less than the convergent percentage. If the demanding range is set to 0.024 mm, then 0.24 mm, the aforesaid maximum deformation of the workpiece 90, has already met the use requirement, and thus the quantity of the support devices 112 can be substantially reduce. For another example, the major difference between FIG. 6 and FIG. 4 is that, in FIG. 6, the quantity of the support devices 112 is smaller than that in FIG. 4. In FIG. 6, though the blacked support devices 112 would be remained inactive, yet the maximum deformation of the workpiece 90 can be still kept at 0.24 mm That is, the same use requirement is still met. Thereupon, manufacturing cost for the support devices 112 can be reduced, or the inactive support devices can be moved to support the other workpiece so as to substantially reduce the time for replacing the workpiece.

Figure 7:
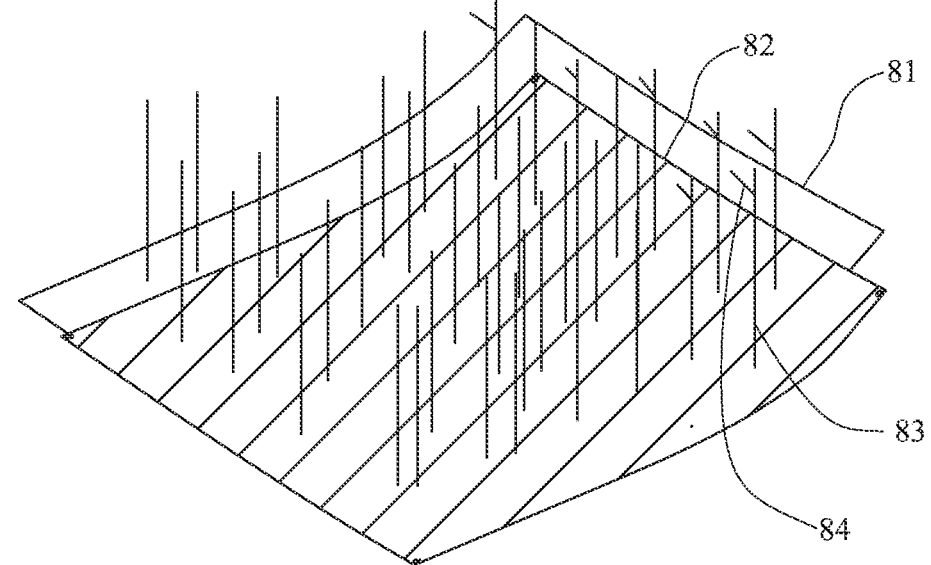
FIG. 7 is a schematic view showing calculated Z-axis coordinates and normal vectors of the support device in accordance with this disclosure.
Figure 8:
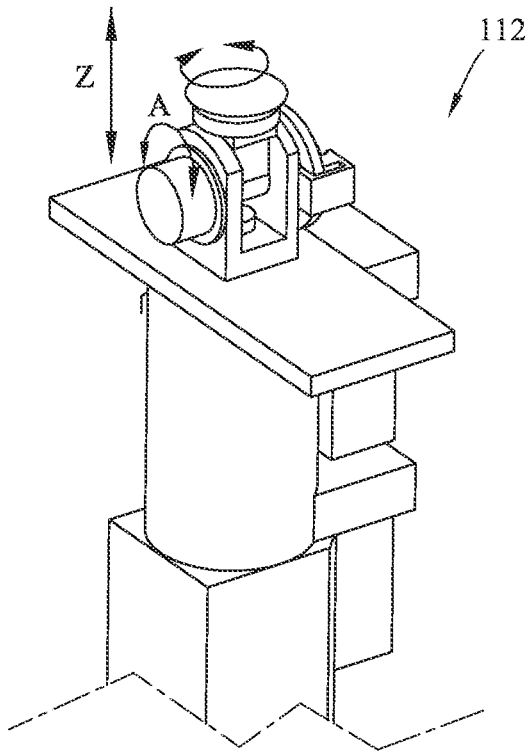
FIG. 8 is a schematic perspective view of an embodiment of the support device in accordance with this disclosure.
Figure 9:
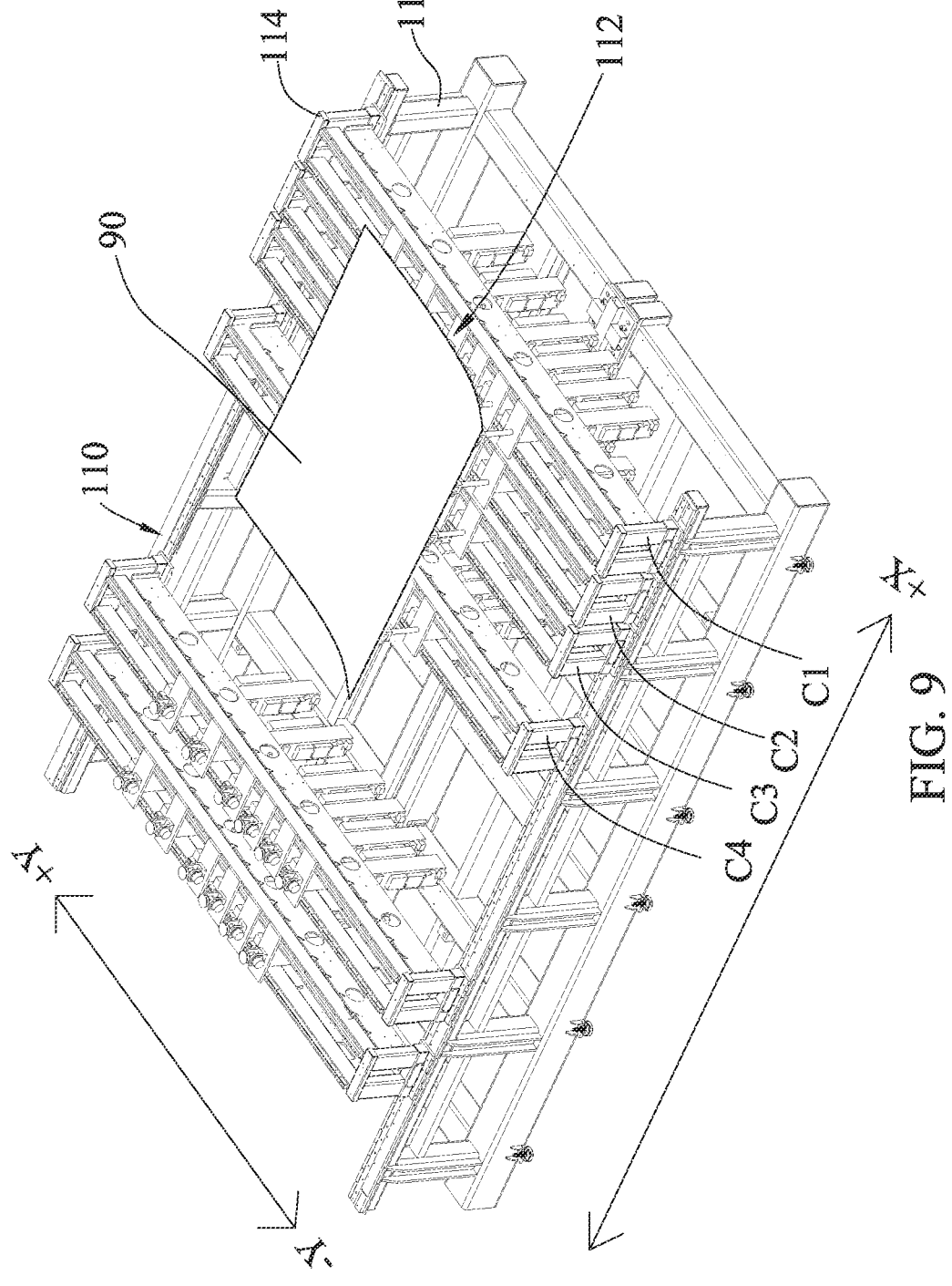
FIG. 9 demonstrates schematically an exemplary example that a workpiece is carried by an already-adjusted variable system for adjusting a workpiece-supporting module in accordance with this disclosure.

In performing Step S150, the coordinate-processing module 130 would evaluate the support-position information and a conversion program so as to obtain a Z-axis coordinate and a normal vector for each of the support devices 112. As shown in FIG. 7 and FIG. 8, the coordinate-processing module 130 utilizes line segments 83 to stand for the optimal support points (X, Y-axis coordinate information) of the individual support devices 112. A second curve surface 82 is a CAD curve surface for the real workpiece of this disclosure. A first curve surface 81 is formed by shifting the second curve surface 82 downward by a specific distance. Referring to FIG. 8, the support device 112 of this disclosure is schematically shown in a perspective view. The specific distance is the distance measured from a rotation center of the A axis of the support device 112 to a top of the support device 112. A method for the coordinate-processing module 130 to calculate the Z-axis coordinate of the support device 112 is to obtain a vertical distance from an intersection point of the first curve surface 81 and the corresponding line segment 83 to the X-Y plane. Further, a method for the coordinate-processing module 130 to calculate the A-axis and C-axis coordinates of the support device 112 includes the following steps. Firstly, among all the normal vectors on the second curve surface 82, locate one normal vector that just passes through the intersection point of the first curve surface 81 and the corresponding line segment 83, and the distance from the intersection point to the second curve surface 81 is the specific distance. Then, this normal vector is the target normal vector, as the line segment 84 shown in FIG. 7. Then, Cartesian coordinate information of the line segment 84 (i.e., the instant normal vector) is used to calculate the A-axis and C-axis initial coordinates of the support device 112. Finally, in performing Step S160, the control module 140 evaluates the support position information, the Z-axis coordinates and the corresponding normal vectors to adjust positions and angles of the corresponding support devices. Step S160 includes a step of having the coordinate-processing module 130 to collect the optimal support points (X-axis and Y-axis coordinate information), the Z-axis coordinates and the A-axis and C-axis coordinates of the related support devices 112, and then following the procedures in accordance with the variable system for adjusting a workpiece-supporting module 100. For example, these procedures include: locating the X-axis direction and Y-axis directions of the support devices 112 and the support assemblies 114, and adjusting the A-axis coordinates, the Z-axis coordinates and the C-axis coordinates of the corresponding support devices 112. While in locating the aforesaid X-axis directions and Y-axis directions, the A-axis coordinates, the Z-axis coordinates and the C-axis coordinates of the support devices 112 can be orderly adjusted at the same time. Thus, positioning of this disclosure can be quickly processed.

In summary, in the method for adjusting a workpiece-supporting module and the variable system for adjusting the same workpiece-supporting module provided b the present disclosure, the finite element method is applied to analyze the CAD file of the workpiece, so that the workpiece deformation information can be obtained. Further, by having the least deformations as the search target for the workpiece, the optimal support points for the workpiece can be realized. In addition, the coordinate-processing module is used to obtain the X-axis coordinates, the Y-axis coordinates, the Z-axis coordinates and the normal vectors of the corresponding support devices, and further the control module is used to adjust the target positions (including the X-axis coordinates, the Y-axis coordinates and the corresponding Z-axis coordinates) and angles of the corresponding support devices and angle for supporting the workpiece.

Further, this disclosure can be applied to relevantly adjust positions of the support assemblies and the support devices. Even upon when the least deformation of the workpiece is requested, the required quantity of the support devices can be reduced, and the distribution density of the support devices can be lowered as well.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A method for adjusting a workpiece-supporting module, comprising the steps of:

(a1) providing an adjustable support module, wherein the adjustable support module includes a plurality of support assemblies moving in an X-axis direction;

(a2) setting initial support position information of a workpiece, wherein the initial support position information includes positions of a plurality of support devices and a spacing value for two said neighboring support devices of the plurality of support devices, wherein each of the plurality of support devices is disposed in one said support assembly of the plurality of support assemblies, and each of the plurality of support devices is movable in a Y-axis direction;

(b) according to the initial support position information, using a finite element method to analyze a CAD file of the workpiece to obtain workpiece deformation information;

(c) according to the workpiece deformation information and target workpiece deformation information, determining support position information corresponding to each of the plurality of support devices and the plurality of support assemblies, wherein the support position information includes X-axis coordinates and Y-axis coordinates of each of the plurality of support devices;

(d) obtaining a Z-axis coordinate and a normal vector of each of the plurality of support devices according to the support position information; and (e) according to the support position information, the Z-axis coordinate, and the normal vector, adjusting the position and the angle of each of the plurality of support devices to support the workpiece with minimal deformation;

wherein the step (c) further includes the steps of:

(c1) defining search variables as the positions of each of the plurality of support assemblies and each of the plurality of support devices;

(c2) according to a target function, determining whether or not, in a current iteration whether the workpiece deformation information is less than a convergent percentage;

(c3) if positive, determining that the workpiece deformation information is the support position information; and (c4) if negative, updating the search variables for another iteration to determine whether or not the workpiece deformation information is less than the convergent percentage.

2. The method for adjusting a workpiece-supporting module of claim 1, wherein the initial support position information further includes a position of each of the plurality of support assemblies and another spacing spacing value for separating two said neighboring support assemblies of the plurality of support assemblies.

3. The method for adjusting a workpiece-supporting module of claim 1, further including a step of limiting each of the plurality of support assemblies and each of the plurality of support devices to move within an occupation region of the workpiece.

4. The method for adjusting a workpiece-supporting module of claim 1, wherein the step (b) further includes the steps of:

(b1) defining initial positions of each of the plurality of support devices and each of the plurality of support assemblies to be fixed spacing of the initial support position information;

(b2) according to the initial support position information, performing initial-point setting upon distributed supportive points of the workpiece so as to obtain a set of support points for the workpiece; and (b3) according to the set of support points, applying the finite element method to analyze deformations of the workpiece.

5. The method for adjusting a workpiece-supporting module of claim 1, wherein the step (c2) further includes the steps of:

(c21) determining whether or not the workpiece deformation information is within a demanding range;

(c22) if positive, moving part of the plurality of support devices out of the occupation region of the workpiece; and (c23) if negative, keeping determining whether or not the workpiece deformation information is less than the convergent percentage.

\* \* \* \* \*